(12) United States Patent
Cohen

(10) Patent No.: US 10,637,693 B1
(45) Date of Patent: Apr. 28, 2020

(54) METHOD AND APPARATUS FOR HIGH SPEED MIXED MOMENT ESTIMATION USING QUANTIZATION

(71) Applicant: Mellanox Technologies, Ltd., Yokneam (IL)

(72) Inventor: Shai Cohen, Haifa (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/182,966

(22) Filed: Nov. 7, 2018

(51) Int. Cl.
*H04L 25/03* (2006.01)
*H04L 27/00* (2006.01)
*H03M 1/06* (2006.01)
*H04L 27/233* (2006.01)
*H04L 27/38* (2006.01)

(52) U.S. Cl.
CPC ......... *H04L 25/03343* (2013.01); *H03M 1/06* (2013.01); *H04L 25/03006* (2013.01); *H04L 27/0004* (2013.01); *H04L 27/2334* (2013.01); *H04L 27/3809* (2013.01)

(58) Field of Classification Search
CPC ............... H03M 1/06; H04L 25/03006; H04L 27/0004; H04L 27/2334; H04L 27/3809; H04L 7/042
USPC ......................................................... 375/231
See application file for complete search history.

(56) References Cited

U.S. PATENT DOCUMENTS

| | | | | |
|---|---|---|---|---|
| 6,031,478 A * | 2/2000 | Oberhammer | ........ | H03M 1/188 341/139 |
| 6,333,707 B1 * | 12/2001 | Oberhammer | ........ | H03M 1/188 341/139 |
| 6,710,729 B1 * | 3/2004 | Chen | ................... | H03M 3/3287 341/143 |

* cited by examiner

*Primary Examiner* — Leila Malek
(74) *Attorney, Agent, or Firm* — Alston & Bird LLP

(57) ABSTRACT

Embodiments are disclosed for moment estimation in high-speed electrical signal processing. An example apparatus includes a first attenuator configured to attenuate a first analog signal to be integrated so as to generate a first attenuated signal. The apparatus further includes a second attenuator configured to attenuate a second analog signal to be integrated so as to generate a second attenuated signal. The apparatus further includes a first slicer configured to directly receive the first attenuated signal from the first attenuator and to slice the first attenuated signal to generate a first quantized signal. The first slicer introduces Gaussian noise to the first attenuated signal. The apparatus further includes a second slicer configured to directly receive the second attenuated signal from the second attenuator and to slice the second attenuated signal to generate a second quantized signal. The second slicer introduces Gaussian noise to the second attenuated signal. The apparatus further includes an exclusive or (XOR) gate configured to receive the first quantized signal and the second quantized signal as input. The apparatus further includes an integrator configured to receive an output of the XOR gate, wherein an output of the integrator is used for moment estimation.

20 Claims, 3 Drawing Sheets

METHOD AND APPARATUS FOR HIGH SPEED MIXED MOMENT ESTIMATION USING QUANTIZATION

BACKGROUND

Embodiments of the present invention relate generally to high speed mixed moment estimation using quantization. More specifically, embodiments of the present invention relate to high speed mixed moment estimation in the context of signal processing, for example, in link training of transmitters and receivers used in high-speed communication, such as for greater than 25 Gigabit Ethernet communication.

BRIEF SUMMARY

Example embodiments described herein disclose a method and an apparatus for quantization in moment estimation. The details of some embodiments of the subject matter described in this specification are set forth in the accompanying drawings and the description below. Other features, aspects, and advantages of the subject matter will become apparent from the description, the drawings, and the claims.

In accordance with an example embodiment, an apparatus used for moment estimation in high-speed electrical signal processing is provided. The apparatus includes a first attenuator configured to attenuate a first analog signal to be integrated so as to generate a first attenuated signal. The apparatus further includes a second attenuator configured to attenuate a second analog signal to be integrated so as to generate a second attenuated signal. The apparatus further includes a first slicer configured to directly receive the first attenuated signal from the first attenuator and to slice the first attenuated signal to generate a first quantized signal. The first slicer introduces Gaussian noise to the first attenuated signal. The apparatus further includes a second slicer configured to directly receive the second attenuated signal from the second attenuator and to slice the second attenuated signal to generate a second quantized signal. The second slicer introduces Gaussian noise to the second attenuated signal. The apparatus further includes an exclusive or (XOR) gate configured to receive the first quantized signal and the second quantized signal as input. The apparatus further includes an integrator configured to receive an output of the XOR gate, wherein an output of the integrator is used for moment estimation.

In some implementations of such an apparatus, the apparatus does not include a dither. In some embodiments, a first signal to noise ratio (SNR) associated with the first quantized signal is approximately 1 Decibel and a second signal to noise ratio (SNR) associated with the second quantized signal is approximately 1 Decibel. In some embodiments, the integrator is a counter initialized while the first attenuator receives the first analog signal. In some embodiments, the first attenuator is further configured to receive a first control signal that controls a first attenuation coefficient associated with the first attenuator and the second attenuator is further configured to receive a second control signal that controls a second attenuation coefficient associated with the second attenuator. In some embodiments, the first slicer is configured to slice the first attenuated signal according to a pre-defined sampling frequency and the first quantized signal is a sign function of the first attenuated signal. In some embodiments, the second slicer is configured to slice the second attenuated signal according to a pre-defined sampling frequency and the second quantized signal is a sign function of the second attenuated signal. In some embodiments, the first attenuator and the second attenuator do not appreciably distort waveforms associated with the first analog signal and the second analog signal. In some embodiments, the apparatus further comprises a counter configured to count a number of symbols used for correlation calculation.

In accordance with another example embodiment, a method for integrating two signals for the purpose of moment estimation is provided. The method includes attenuating a first analog signal to be integrated so as to generate a first attenuated signal. The method further includes attenuating a second analog signal to be integrated so as to generate a second attenuated signal. The method further includes slicing the first attenuated signal to generate a first quantized signal. The first slicer introduces Gaussian noise to the first attenuated signal. The method further includes slicing the second attenuated signal to generate a second quantized signal. The second slicer introduces Gaussian noise to the second attenuated signal. The method further includes using an exclusive or (XOR) gate configured to receive the first quantized signal and the second quantized signal to generate an output. The method further includes using a first counter to count the output of the XOR gate. The method further includes using a second counter to count the number of symbols used for correlation calculation.

In some implementations of such a method, a first signal to noise ratio (SNR) associated with the first quantized signal is approximately 1 Decibel and a second signal to noise ratio (SNR) associated with the second quantized signal is approximately 1 Decibel. In some embodiments, the counter is initialized while the first attenuator receives the first analog signal. In some embodiments, attenuating the first analog signal comprises receiving a first control signal that controls a first attenuation coefficient used for attenuating the first analog signal. In some embodiments, attenuating the second analog signal comprises receiving a second control signal that controls a second attenuation coefficient used for attenuating the second analog signal. In some embodiments, a first signal to noise ratio (SNR) associated with the first quantized signal is dependent on the first attenuation coefficient and a second signal to noise ratio (SNR) associated with the second quantized signal is dependent on the second attenuation coefficient. In some embodiments, the second slicer is configured to slice the second attenuated signal according to a pre-defined sampling frequency, and wherein the second quantized signal is a sign function of the second attenuated signal. In some embodiments, the first attenuator and the second attenuator do not appreciably distort waveforms associated with the first analog signal and the second analog signal. In some embodiments, the first slicer is configured to slice the first attenuated signal according to a pre-defined sampling frequency, and wherein the first quantized signal is a sign function of the first attenuated signal. In some embodiments, the first counter and the second counter are initialized at the same time.

BRIEF DESCRIPTION OF THE DRAWINGS

Figure 1:
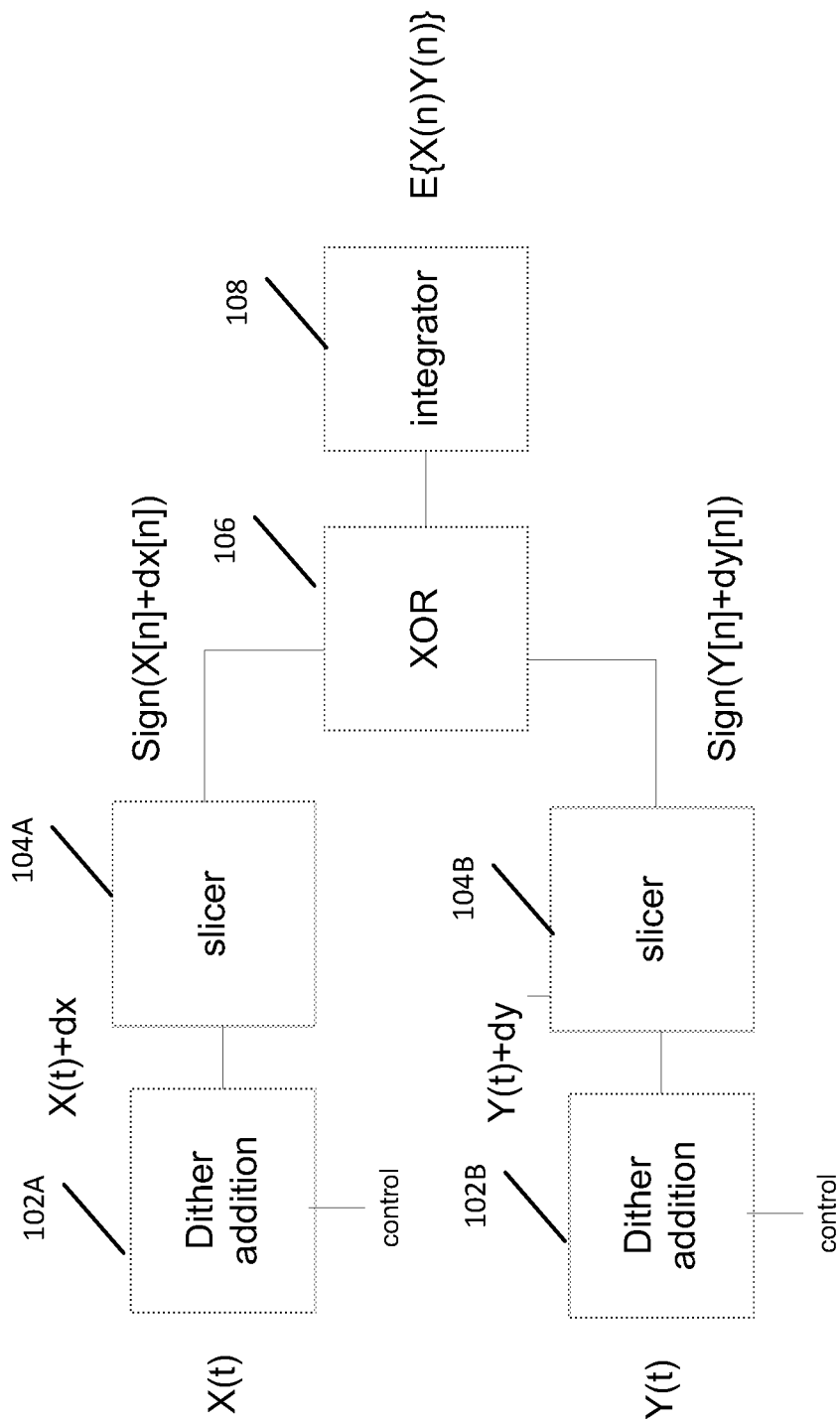
Figure 2:
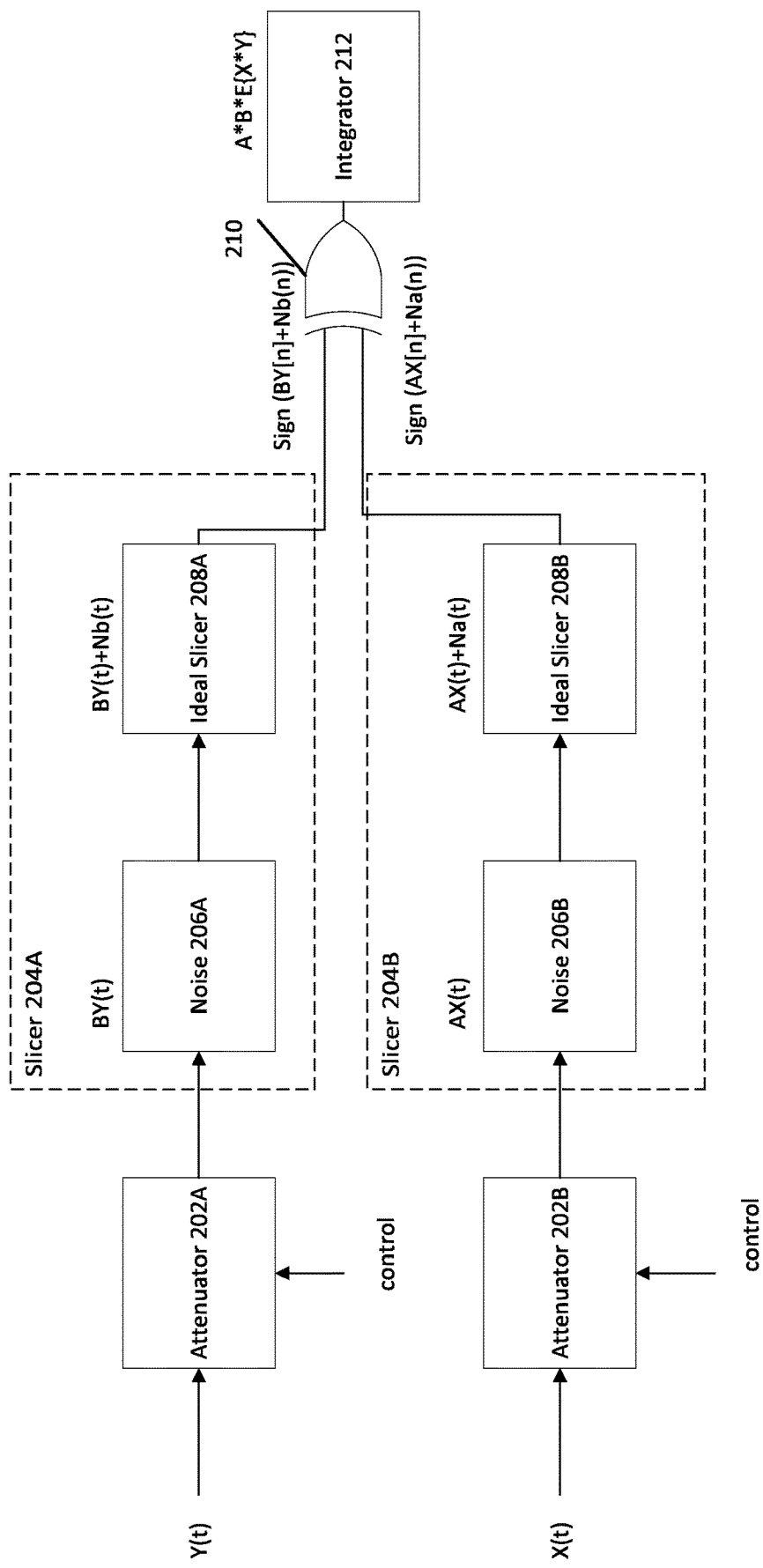
Figure 3:
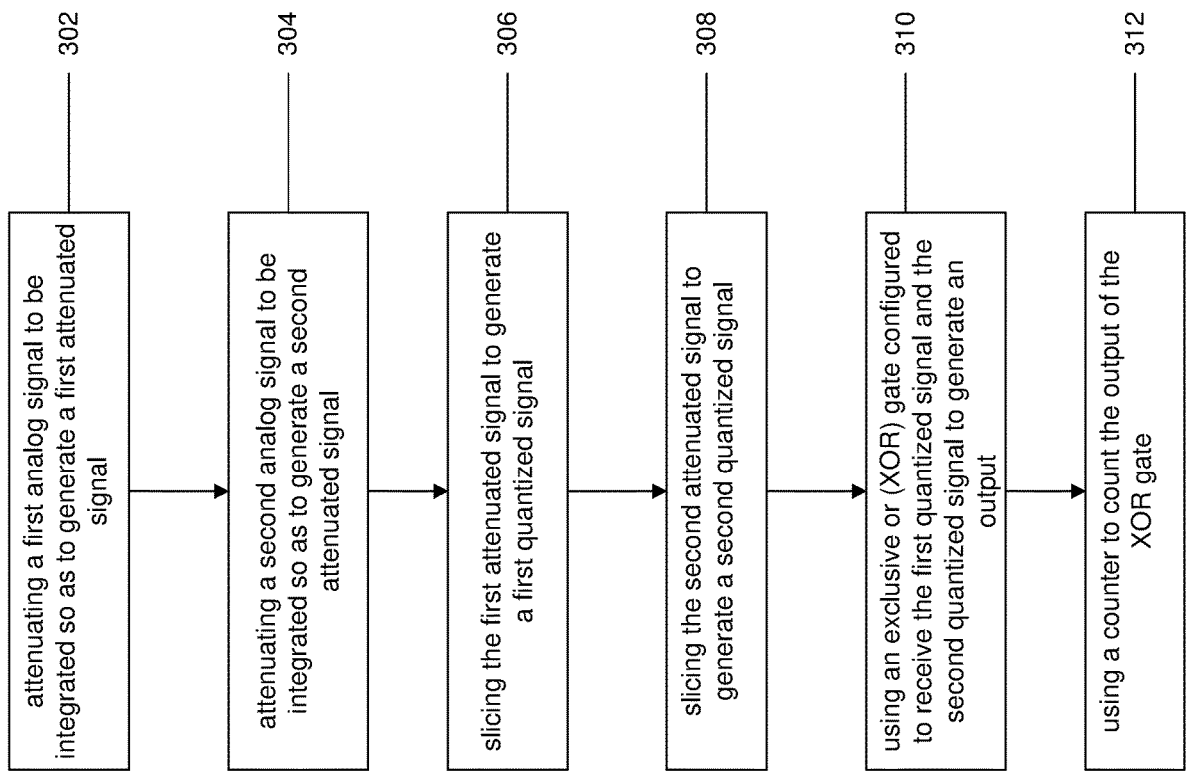

Having thus described the invention in general terms, reference will now be made to the accompanying drawings, which are not necessarily drawn to scale, and wherein:

FIG. 1 illustrates a block diagram of an example traditional signal processing block utilized for moment estimation;

FIG. 2 illustrates a block diagram of an example signal processing block utilized for moment estimation according to example embodiments of the invention;

FIG. 3 is a flowchart illustrating an example method for integrating two analog signals for the purpose of moment estimation according to example embodiments of the invention.

DETAILED DESCRIPTION OF THE INVENTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The term "exemplary," as may be used herein, is not provided to convey any qualitative assessment, but instead merely to convey an illustration of an example. Thus, use of any such terms should not be taken to limit the spirit and scope of embodiments of the present invention.

Quantization is the process of mapping input values from a set to output values in another set. For example, in signal processing of communication systems, quantization may be the process of quantizing an analog signal to generate a quantized digital signal based on amplitude values of the analog signal. Quantization is a widely prevalent technique in all signal processing systems. For example, quantization may be used to improve noise immunity of a communication system or during link training of transmitters and receivers of a communication system. Link training is a process in which the transmitter and the receiver of a high-speed communication system communicate with each other for the purpose of tuning their equalization settings to achieve a desired result, such as a desired bit error rate (BER).

The difference between an input value and its quantized value may be referred to as quantization error. For an ideal signal processing system, quantization error would affect a signal processing system in a similar manner to white noise which has negligible correlation with the analog signal itself and has an approximately flat power spectral density. However, such an ideal situation often does not occur in the real world. Without any additional tuning, the quantization error may be deterministically related to the input analog signal itself rather than being independent of the input signal. If the quantization error is deterministically related to the input analog signal itself, different problems may occur. For example, a periodic signal may introduce periodic quantization noise from the quantization error that can introduce problems in subsequent signal processing.

Therefore, different techniques are used to ensure that the quantization error is not dependent on the input signal. FIG. 1 illustrates a block diagram of an example traditional signal processing block utilized for moment estimation using one bit quantization that addresses this issue by introducing dithers. As illustrated in FIG. 1, the traditional signal processing block utilizes two dithers 102A and 102B to introduce noise to the input analog signals X(t) and Y(t). Dither is an intentionally applied form of noise used to randomize quantization error to ensure that the quantization error is not dependent on the input signals.

In the conventional system illustrated in FIG. 1, after the dithers 102A and 102B add dither noise to the input analog signals X(t) and Y(t), the analog signals become X(t)+dx and Y(t)+dy, where dx and dy denote the dither noise introduced to the analog signals X(t) and Y(t). The slicers 104A and 104B (which may also be referred to as quantizers) are configured to generate quantized digital signals (which are discrete) based on the input analog signals X(t)+dx and Y(t)+dy (which are continuous), such as by mapping amplitude values of the input analog signal at different time instances to digital values. The frequency of sampling is referred to as the sampling rate or sampling frequency. In some examples, the output of the slicers 104A and 104B are Sign (X[n]+dx[n]) and Sign (Y[n]+dy[n]). Sign denotes a sign function which is a function used to extract the sign of a real number. X[n]+dx[n] denotes the sequence of samples generated based on X(t)+dx and similarly Y[n]+dy[n] denotes the sequence of samples generated based on Y(t)+dy.

The output of the two slicers 104A and 104B in the illustrated conventional system of FIG. 1 may be subsequently fed into the exclusive or (XOR) gate 106. The XOR gate 106 may subsequently feed its output to the integrator 108. The integrator may be a counter which may generate $E\{X(n)Y(n)\}$.

The traditional solution illustrated in FIG. 1 is effective but has a key drawback. This solution requires a noise source to be designed and integrated into a critical signal path in a signal processing system. The use of a separate, dedicated noise source adds complexity, adds circuit loading, and takes space. Another common solution in the context of a signal processing block utilized for moment estimation using quantization is to design an analog high bandwidth multiplier followed by an integrator. This solution has the key drawback of having poor sensitivity as it is not using data sampled at the right phase (desired SNR). In addition, multiplying two very small signals may introduce additional issues by itself. Another common solution in the context of signal processing block utilized for moment estimation using quantization is to use a high rate analog to digital converter and post processing the output of the analog to digital converter. But this solution also introduces additional complexity, takes space, and may be very expensive to implement.

FIG. 2 illustrates a block diagram of an example signal processing blocks utilized for moment estimation using one bit quantization according to example embodiments of the invention. As illustrated in FIG. 2, the example signal processing block includes two attenuators 202A and 202B. Two analog signals X(t) and Y(t) are input to the attenuators 202A and 202B. The attenuators 202A and 20B are configured to attenuate the amplitude of the analog signals X(t) and Y(t) without appreciably distorting their waveforms. The attenuators 202A and 202B may further receive respective control signals which control the attenuation coefficients associated with the attenuators 202A and 202B.

After the attenuators 202A and 202B attenuate the input analog signals X(t) and Y(t), the two attenuated signals of the analog signals (denoted by BY(t) and AX(t)) are directly transmitted to two slicers 204A and 204B. In other words, this example embodiment does not utilize a separate dither. Rather, the slicers 204A and 204B introduce Gaussian noise. In other words, the inherent Gaussian noise of the slicers 204A and 204B are used as a noise source. As such, embodiments of the present invention provide for each attenuator 202A, 202B to communicate directly with the respective slicer 204A, 204B, with no intermediate components such as the dither of conventional systems between the two.

With reference to FIG. 2, the slicer 204A (which are actual) may be considered to be two separate components—a noise component 206A and an ideal slicer 208A. The noise component 206A is denoted by Nb(t) and may be an input referred noise. The noise along with the attenuated analog signal BY(t)+Nb(t) may be sliced by the ideal slicer 208A to generate Sign(BY[n]+Nb(n)) which may be then fed into an XOR gate 210. Sign denotes a sign function which is a function used to extract the sign of a real number, and BY[n]+Nb(n) denotes the sequence of samples generated based on BY(t)+Nb(t).

Similarly, the slicer 204B may be considered to include a noise component 206B and an ideal slicer 208B. The noise component 206A is denoted by Na(t) and may be an input referred noise. The noise along with the attenuated analog signal AY(t)+Na(t) may be sliced by the ideal slicer 208B to generate Sign (Ax[n]+Na[n]) which may be then fed into an XOR gate 210. Sign denotes sign function which is a function used to extract the sign of a real number, and Ax[n]+Na[n] denotes the sequence of samples generated based on AY(t)+Na(t). In some embodiments, SNR associated with the outputs of the slicers is about 1 dB. The SNR may be calibrated by adjusting the attenuation coefficients of the attenuators 202A and 202B.

The two outputs of the slicers 204A and 204B, may be fed into an XOR gate 210 and the XOR gate 210 may subsequently feed its output to an integrator 212. In some embodiments, the integrator 212 is a counter and the output of the integrator 212 is denoted by A*B*E{X*Y}. The counter may need to be initialized before each measurement run and, therefore, may be initialized during X(t) and Y(t) are fed into the attenuators 202A and 202B. For example, another high speed counter may be running in parallel with the counter to count the number of symbols being integrated. Both counters may be initialized at the same time. In embodiments where the integrator is a counter, E{X*Y}~2*{1/N*sum (XOR(x,y)−0.5)}]. N is a configurable number of bits.

As such, the inherent analog Gaussian noise of the slicers 204A and 204B is utilized instead of requiring the use of a separate dither.

FIG. 3 is a flowchart illustrating an example method for integrating two analog signals for the purpose of moment estimation according to example embodiments of the invention.

With reference to FIG. 3, in some embodiments, at operation 302, the method includes attenuating a first analog signal to be integrated, such as by using a first attenuator, to generate a first attenuated signal. The first attenuator, for example, may be the attenuator 202A illustrated in FIG. 2, the first analog signal may be Y(t), and the first attenuated signal may be BY(t).

In some embodiments, at operation 304, the method further includes attenuating a second analog signal to be integrated, such as by using a second attenuator, to generate a second attenuated signal. The second attenuator may be the attenuator 202B illustrated in FIG. 2, the first analog signal may be X(t), and the first attenuated signal may be AX(t). In some embodiments, the first attenuator may be further configured to receive a first control signal that controls a first attenuation coefficient associated with the first attenuator. In some embodiments, the second attenuator may be further configured to receive a second control signal that controls a second attenuation coefficient associated with the second attenuator.

In some embodiments, at operation 306, the method may include slicing the first attenuated signal to generate a first quantized signal, such as by using a first slicer. The first slicer may introduce Gaussian noise to the first attenuated signal. The first slicer may be the slicer 204A illustrated in FIG. 2, the first quantized signal may be Sign(BY[n]+Nb (n)), and the Gaussian noise may be Nb(t).

In some embodiments, at operation 308, the method may include slicing the second attenuated signal to generate a second quantized signal, such as by using a second slicer. The second slicer introduces Gaussian noise to the second attenuated signal. The second slicer may be the slicer 204B illustrated in FIG. 2, the first quantized signal may be Sign(AX[n]+Na(n)), and the Gaussian noise may be Na(t). In some embodiments, a first signal to noise ratio (SNR) associated with the first quantized signal is approximately 1 dB, and a second signal to noise ratio (SNR) associated with the second quantized signal is approximately 1 dB.

In some embodiments, at operation 308, the method includes using an exclusive or (XOR) gate configured to receive the first quantized signal and the second quantized signal to generate an output.

In some embodiments, at operation 308, the method further includes using a counter to count the output of the XOR gate. The output of the counter may be utilized for moment estimation. In some embodiments, the counter may need to be initialized before each measurement is run. Therefore, the counter may be initialized before the first analog signal and the second analog signal are received by the attenuators. The method may further include using a second counter to count the number of symbols used for correlation calculation.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. An apparatus used for moment estimation in high-speed electrical signal processing comprising:
   a first attenuator configured to attenuate a first analog signal to be integrated so as to generate a first attenuated signal;
   a second attenuator configured to attenuate a second analog signal to be integrated so as to generate a second attenuated signal;
   a first slicer configured to directly receive the first attenuated signal from the first attenuator and to slice the first attenuated signal to generate a first quantized signal, wherein the first slicer introduces Gaussian noise to the first attenuated signal;
   a second slicer configured to directly receive the second attenuated signal from the second attenuator and to slice the second attenuated signal to generate a second quantized signal, wherein the second slicer introduces Gaussian noise to the second attenuated signal;
an exclusive or (XOR) gate configured to receive the first quantized signal and the second quantized signal as input; and
an integrator configured to receive an output of the XOR gate, wherein an output of the integrator is used for moment estimation.

2. The apparatus of claim 1, wherein the apparatus does not include a dither.

3. The apparatus of claim 1, wherein a first signal to noise ratio (SNR) associated with the first quantized signal is approximately 1 Decibel, and wherein a second signal to noise ratio (SNR) associated with the second quantized signal is approximately 1 Decibel.

4. The apparatus of claim 1, wherein the integrator is a counter initialized while the first attenuator receives the first analog signal.

5. The apparatus of claim 1, wherein the first attenuator is further configured to receive a first control signal that controls a first attenuation coefficient associated with the first attenuator, and wherein the second attenuator is further configured to receive a second control signal that controls a second attenuation coefficient associated with the second attenuator.

6. The apparatus of claim 5, wherein a first signal to noise ratio (SNR) associated with the first quantized signal is dependent on the first attenuation coefficient, and wherein a second signal to noise ratio (SNR) associated with the second quantized signal is dependent on the second attenuation coefficient.

7. The apparatus of claim 1, wherein the first slicer is configured to slice the first attenuated signal according to a pre-defined sampling frequency, and wherein the first quantized signal is a sign function of the first attenuated signal.

8. The apparatus of claim 1, wherein the second slicer is configured to slice the second attenuated signal according to a pre-defined sampling frequency, and wherein the second quantized signal is a sign function of the second attenuated signal.

9. The apparatus of claim 1, wherein the first attenuator and the second attenuator do not appreciably distort waveforms associated with the first analog signal and the second analog signal.

10. The apparatus of claim 1, further comprising a counter configured to count a number of symbols used for correlation calculation.

11. A method for integrating two signals for the purpose of moment estimation, comprising:
attenuating a first analog signal, using a first attenuator, to be integrated so as to generate a first attenuated signal;
attenuating a second analog signal, using a second attenuator, to be integrated so as to generate a second attenuated signal;
slicing the first attenuated signal, using a first slicer, to generate a first quantized signal, wherein the first slicer introduces Gaussian noise to the first attenuated signal;
slicing the second attenuated signal, using a second slicer, to generate a second quantized signal, wherein the second slicer introduces Gaussian noise to the second attenuated signal;
using an exclusive or (XOR) gate configured to receive the first quantized signal and the second quantized signal to generate an output;
using a first counter to count the output of the XOR gate; and
using a second counter to count a number of symbols used for correlation calculation.

12. The method of claim 11, wherein a first signal to noise ratio (SNR) associated with the first quantized signal is approximately 1 Decibel, and wherein a second signal to noise ratio (SNR) associated with the second quantized signal is approximately 1 Decibel.

13. The method of claim 11, wherein the first counter is initialized while the first attenuator receives the first analog signal.

14. The method of claim 11, wherein the method does not include using a dither.

15. The method of claim 11, wherein attenuating the first analog signal comprises receiving a first control signal that controls a first attenuation coefficient used for attenuating the first analog signal, and wherein attenuating the second analog signal comprises receiving a second control signal that controls a second attenuation coefficient used for attenuating the second analog signal.

16. The method of claim 15, wherein a first signal to noise ratio (SNR) associated with the first quantized signal is dependent on the first attenuation coefficient, and wherein a second signal to noise ratio (SNR) associated with the second quantized signal is dependent on the second attenuation coefficient.

17. The method of claim 11, wherein slicing the first attenuated signal comprises slicing according to a pre-defined sampling frequency, and wherein the first quantized signal is a sign function of the first attenuated signal.

18. The method of claim 11, wherein slicing the second attenuated signal comprises slicing according to a pre-defined sampling frequency, and wherein the second quantized signal is a sign function of the second attenuated signal.

19. The method of claim 11, wherein the first attenuator and the second attenuator do not appreciably distort waveforms associated with the first analog signal and the second analog signal.

20. The method of claim 11, wherein the first counter and the second counter are initialized simultaneously.

* * * * *